(12) United States Patent
Hennig

(10) Patent No.: US 6,881,446 B2
(45) Date of Patent: Apr. 19, 2005

(54) METHOD AND DEVICE FOR PRODUCTION OF ENDLESS PLASTIC HOLLOW PROFILES

(75) Inventor: Christoph Hennig, Schwabach (DE)

(73) Assignee: Ivt Installations - und Verbindungstechnik GmbH & CO KG, Rohr (DE)

( * ) Notice: Subject to any disclaimer, the term of this patent is extended or adjusted under 35 U.S.C. 154(b) by 0 days.

(21) Appl. No.: 10/472,387

(22) PCT Filed: Mar. 20, 2002

(86) PCT No.: PCT/EP02/03056

§ 371 (c)(1),
(2), (4) Date: Sep. 23, 2003

(87) PCT Pub. No.: WO02/077315

PCT Pub. Date: Oct. 3, 2002

(65) Prior Publication Data

US 2004/0081763 A1  Apr. 29, 2004

(30) Foreign Application Priority Data

Mar. 24, 2001 (DE) .......................................... 101 14 485

(51) Int. Cl.⁷ .................... C23C 16/02; C23C 16/06; C23C 16/54; B29C 71/00; B05D 3/00
(52) U.S. Cl. .................... 427/251; 427/532; 427/541; 427/248.1; 427/250; 427/255.5; 427/255.6; 427/294; 427/296; 427/299; 427/123; 427/124; 427/314; 427/316; 427/322; 427/372.2; 427/384; 427/385.5; 427/393.5; 427/402; 427/404; 427/407.1; 427/412.1; 118/715; 118/733; 118/72; 118/73; 118/DIG. 11; 425/92; 425/110; 425/383; 425/392

(58) Field of Search .................... 428/35.7, 35.8, 428/35.9, 36.6, 36.9, 36.91, 457; 427/532, 533, 534, 535, 536, 537, 553, 557, 123, 124, 250, 294, 296, 299, 314, 322, 407.1; 264/165, 176.1, 209.1, 209.3, 211.12, 211.2

(56) References Cited

U.S. PATENT DOCUMENTS

| | | | | |
|---|---|---|---|---|
| 2,626,426 A | * | 1/1953 | Stahl | 264/129 |
| 2,945,258 A | * | 7/1960 | Houston | 425/71 |
| 2,993,806 A | * | 7/1961 | Fisher et al. | 428/216 |
| 4,112,190 A | * | 9/1978 | Sato et al. | 428/457 |
| 4,407,871 A | * | 10/1983 | Eisfeller | 428/31 |
| 4,431,711 A | * | 2/1984 | Eisfeller | 428/31 |
| 5,021,298 A | * | 6/1991 | Revell | 428/458 |
| 5,330,600 A | * | 7/1994 | Lupke | 156/242 |
| 5,773,154 A | * | 6/1998 | Takada | 428/458 |
| 6,355,304 B1 | * | 3/2002 | Braun | 427/250 |

FOREIGN PATENT DOCUMENTS

| | | | |
|---|---|---|---|
| DE | 33 20 273 A | | 12/1984 |
| GB | 1094785 | * | 12/1967 |
| WO | WO 02 01115 A | | 1/2002 |

* cited by examiner

*Primary Examiner*—Vivian Chen
(74) *Attorney, Agent, or Firm*—Sughrue Mion, PLLC

(57) ABSTRACT

A method for production of endless plastic hollow profiles, in particular tubes, comprises several production stages for the plastic tube and a coating stage for a metal coating. A reduced pressure is provided in the coating stage, whereby the metal is transferred into the gas phase and deposited on the tube as a surface layer homogeneously bonded thereto.

10 Claims, 1 Drawing Sheet

METHOD AND DEVICE FOR PRODUCTION OF ENDLESS PLASTIC HOLLOW PROFILES

BACKGROUND OF THE INVENTION

1. Field of the Invention

The invention relates to a method of producing endless plastic hollow profiles, particularly tubes, as well as to a device for carrying out the method, consisting of several production stages for the plastic tube and a stage for application of an outer metal casing.

2. Description of Related Art

Coatings of plastic materials by means of thin-layer technology are known particularly in the packaging industry. In that case a minimum metallic layer is applied at one side at high speed to a plastic film. This known method is not usable for the circumferential surface of hollow profiles, particularly tubes, to which a layer with uniform thickness is to be applied, since in accordance with this method films can always only be coated at one side.

SUMMARY OF THE INVENTION

The invention is therefore based on the object of creating, for hollow profiles, a method by which a technically usable metal coating can be produced in accordance with thin-layer technology at high production speed.

According to the invention this object is fulfilled in that the method involves application of a liquid polymer to the surface of a tube and subsequently a bonded metal layer is applied in a gas-tight layer thickness.

Refinements and developments of the invention are claimed in the subclaims.

BRIEF DESCRIPTION OF THE DRAWINGS

A device for carrying out the method is described as an example in the drawings, in which.

DETAILED DESCRIPTION OF PREFERRED EMBODIMENTS

Figure 1:
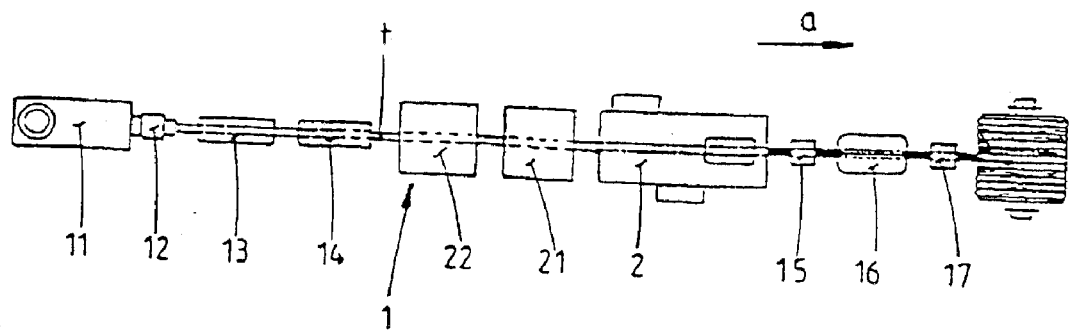
FIG. 1 shows a schematic view of a coating plant, wherein the tube issues from an extrusion plant.

A known device 1 for producing a plastic tube t, for example of polyethylene, consists of an extruder 11, a tool 12, a calibrating path 13, a cooling path 14, a possibly desired printer 15, a withdrawal path 16 for drawing the plastic pipe t in the direction of the arrow a, a cutter 17 and a reel 18 for winding up very long pipe lengths.

According to the invention a system of three stations for coating the plastic tube t with a metal is inserted preferably between the cooling path 14 and the printer 15.

The tube surface after exit of the tube t from the tool 12 is uneven with a cratered form and in this state is not suitable for direct coating. The tube t therefore initially runs through a smoothing path 22 in which a liquid polymer is applied to the tube surface. In the following drying path 21 the applied polymer layer is dried. The tube surface is thereafter suitable for coating.

Instead of application of a liquid polymer, the tube surface can also be smoothed by exposure to flame.

Figure 3:
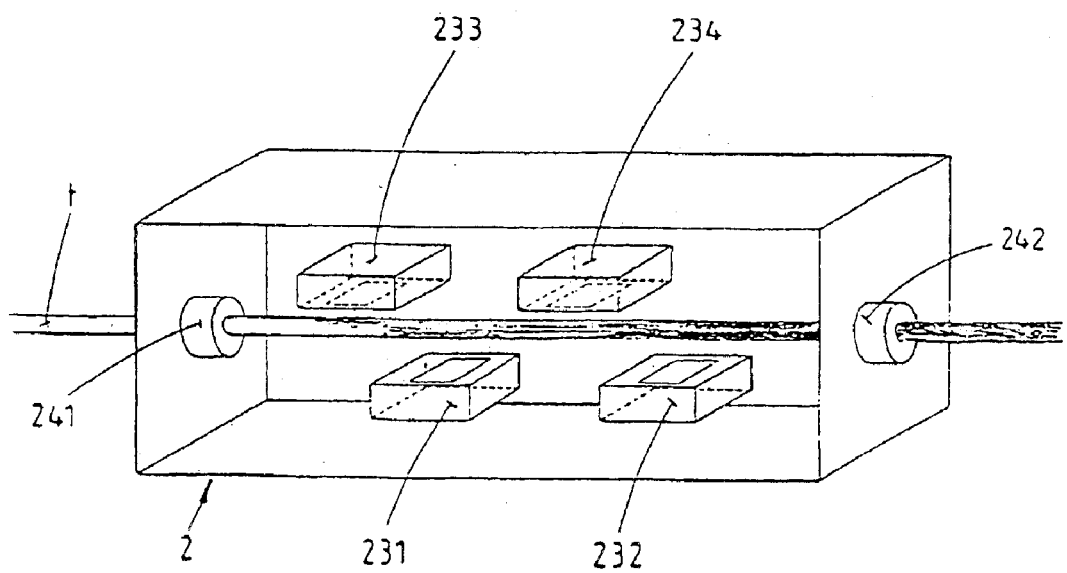
FIG. 3 shows the schematic format of the coating stage.

Subsequently, the thus-pretreated tube t runs through the coating path 2. The internal format of the coating path 2 is illustrated schematically in FIG. 3. Disposed in the interior of the coating path 2 are, for example, four flame treatment modules 231, 232, 233, 234, which are displaced relative to one another in each instance by an angle of 90 degrees so that a uniform coating of the tube t takes place. However, it is also possible to mount the modules to be movable and to let them circulate around the tube t during the coating. The flame treatment modules are electrically heated and evaporate the coating metal, for example aluminium or copper, so that this is transferred into the gas phase and deposits on the tube t. An underpressure preferably prevails in the coating path 2. Due to the very smooth surface of the tube t, expensive sealing measures are not necessary.

A liquid lock, as is known for vacuum containers in continuous production processes, would also be highly disadvantageous for coating in vacuum, since the surface of the tube if wetted by the liquid is no longer capable of being coated. The seals 241, 242 are therefore plastic seals of resilient material.

In the afore-described device 1 it is necessary to design the different lengths of the smoothing path 22, drying path 21 and coating path 22 transited by the tube t so that these can fulfil their tasks at the preset production or extrusion speed.

Figure 2:
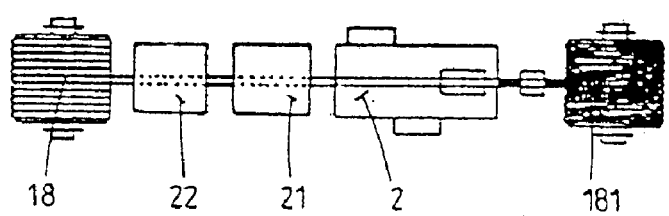
FIG. 2 shows a schematic view of a coating plant, wherein the tube is unwound from a reel.

In FIG. 2 there is reproduced a device 1 in which the tube t to be coated is already present and wound up on a reel 18. It then runs through only the paths 22, 21, 2. In this case the transit speed through the paths 22, 21, 2 is no longer dependent on a production speed, but can be designed exclusively in accordance with the requirements of the three paths 22, 21, 2.

It is feasible to combine the three paths 22, 21, 2 into a unit. In this case only two seals are required.

| Reference Numeral List | |
| --- | --- |
| 1 | device |
| 11 | extruder |
| 12 | tool |
| 13 | calibrating path |
| 14 | cooling path |
| 15 | printer |
| 16 | withdrawal path |
| 17 | cutter |
| 18 | reel |
| 181 | reel |
| 2 | coating path |
| 21 | drying path |
| 22 | smoothing path |
| 231 | flame-exposure module |
| 232 | flame-exposure module |
| 233 | flame-exposure module |
| 234 | flame-exposure module |
| 241 | seal |
| 242 | seal |
| t | plastic pipe |
| a | arrow of the movement direction |

What is claimed is:

1. A method of continuously producing an endless plastic hollow product comprising:

feeding said endless plastic hollow product;

initially smoothing an outside surface of said plastic hollow product by applying a liquid polymer to an outside surface of said plastic hollow product as it is fed; and thereafter, applying a metal to the liquid polymer-coated plastic hollow product as it is fed, wherein said metal layer uniformly and intimately connects with the liquid polymer layer in a mutually gas-tight layer thickness.

2. The method as set forth in claim 1, wherein said metal layer applying step comprises evaporating metal from a plurality of metal evaporation units disposed circumferentially about said plastic hollow profile product as said product is moved.

3. The method of claim 2, wherein said applying step is conducted by circulating a plurality of said units about said plastic hollow profile as it is moved.

4. The method of claim 1 wherein said evaporation step is conducted in an under-pressure environment.

5. The method of claim 1 further comprising drying said polymer after said coating step and before said applying step.

6. A system for producing endless plastic hollow product comprising:

a feeder for feeding said product continuously;

a smoothing unit for coating said endless plastic hollow product with a liquid polymer as said product is fed; and a metal applying unit for transferring in a gas phase and in an underpressure environment a metal onto the polymer-coated endless plastic hollow product, whereby said metal is intimately bonded as a layer in a gas-tight layer thickness.

7. The system as set forth in claim 6 further comprising a plurality of evaporation units located within said applying unit and disposed about different circumferential surface portions of said plastic hollow product as it is fed.

8. The system of claim 7 wherein said plurality of evaporation units are circulated about the circumference of said plastic hollow product as it is fed.

9. The device as set forth in claim 6 further comprising a drying unit disposed between said polymer coating unit and said metal applying unit.

10. The system of claim 6 wherein said metal applying unit is sealed and comprises a housing and at least one port, having resilient materials, through which said plastic hollow product is fed.

* * * * *